United States Patent
Boyle et al.

(10) Patent No.: US 8,486,835 B2
(45) Date of Patent: *Jul. 16, 2013

(54) CZOCHRALSKI GROWTH OF RANDOMLY ORIENTED POLYSILICON AND USE OF RANDOMLY ORIENTED POLYSILICON DUMMY WAFERS

(76) Inventors: James E. Boyle, Saratoga, CA (US); Reese Reynolds, Los Gatos, CA (US); Raanan Y. Zehavi, Sunnyvale, CA (US); Robert W. Mytton, Salem, OR (US); Doris Mytton, legal representative, Salem, OR (US); Tom L. Cadwell, Menlo Park, CA (US)

( * ) Notice: Subject to any disclaimer, the term of this patent is extended or adjusted under 35 U.S.C. 154(b) by 932 days.

This patent is subject to a terminal disclaimer.

(21) Appl. No.: 12/562,929

(22) Filed: Sep. 18, 2009

(65) Prior Publication Data

US 2010/0009123 A1   Jan. 14, 2010

Related U.S. Application Data

(60) Division of application No. 11/959,354, filed on Dec. 18, 2007, now Pat. No. 7,611,989, which is a continuation-in-part of application No. 11/328,438, filed on Jan. 9, 2006, now Pat. No. 7,972,703.

(60) Provisional application No. 60/871,618, filed on Dec. 22, 2006, provisional application No. 60/694,334, filed on Jun. 27, 2005, provisional application No. 60/658,075, filed on Mar. 3, 2005.

(51) Int. Cl.
*H01L 21/44* (2006.01)

(52) U.S. Cl.
USPC ........... 438/680; 438/311; 438/657; 438/752; 257/E21.054; 257/E21.17; 257/E21.227; 257/E21.278; 257/E21.293; 257/E21.483

(58) Field of Classification Search
USPC ............ 438/680, 311, 657, 752, 663, 724, 438/746, 757, 931; 257/54, E21.17, E21.227, 257/E21.237, E21.278, E21.293, E21.483
See application file for complete search history.

(56) References Cited

U.S. PATENT DOCUMENTS

| | | | |
|---|---|---|---|
| 4,040,849 A | 8/1977 | Greskovich et al. | |
| 4,416,913 A | 11/1983 | Ingle et al. | |
| 6,455,395 B1 * | 9/2002 | Boyle et al. | 438/455 |
| 7,611,989 B2 * | 11/2009 | Boyle et al. | 438/680 |
| 7,972,703 B2 * | 7/2011 | Boyle et al. | 428/446 |
| 2003/0003686 A1 | 1/2003 | Boyle et al. | |
| 2003/0119248 A1 | 6/2003 | Mistry et al. | |

FOREIGN PATENT DOCUMENTS

| | | |
|---|---|---|
| JP | 10-144580 H | 5/1998 |
| KR | 2002-0026670 A | 4/2002 |

* cited by examiner

*Primary Examiner* — David Nhu
(74) *Attorney, Agent, or Firm* — Mesmer & Deleault, PLLC (57) ABSTRACT

Non-production wafers of polycrystalline silicon are placed in non-production slots of a support tower for thermal processing monocrystalline silicon wafers. They may have thicknesses of 0.725 to 2 mm and be roughened on both sides. Nitride may be grown on the non-production wafers to a thickness of over 2 μm without flaking. The polycrystalline silicon is preferably randomly oriented Czochralski polysilicon grown using a randomly oriented seed, for example, CVD grown silicon. Both sides are ground to introduce sub-surface damage and then oxidized and etch cleaned. An all-silicon hot zone of a thermal furnace, for example, depositing a nitride layer, may include a silicon support tower placed within a silicon liner and supporting the polysilicon non-production wafers with silicon injector tube providing processing gas within the liner.

16 Claims, 6 Drawing Sheets

(Prior Art)

FIG. 1

(Prior Art)

CZOCHRALSKI GROWTH OF RANDOMLY ORIENTED POLYSILICON AND USE OF RANDOMLY ORIENTED POLYSILICON DUMMY WAFERS

RELATED APPLICATION

This application is a DIV of U.S. application Ser. No. 11/959,354, filed Dec. 18, 2007, now U.S. Pat. No. 7,611,989, which claims the benefit of provisional application 60/871, 618, filed Dec. 22, 2006, and is a continuation in part of U.S. application Ser. No. 11/328,438, now U.S. Pat. No. 7,972, 703, filed Jan. 9, 2006, which claims the benefit of provisional application 60/658,075, filed Mar. 3, 2005, and of provisional application 60/694,334, filed Jun. 27, 2005.

FIELD OF THE INVENTION

The invention relates generally to thermal processing of silicon wafers. In particular, it relates to non-production wafers used in batch thermal processing of production wafers. The invention also relates to a form of polycrystalline silicon useful for such non-production wafers as well as for other uses.

BACKGROUND ART

Batch thermal processing continues to be used for several stages of fabrication of silicon integrated circuits. One low temperature thermal process deposits a layer of silicon nitride by low pressure chemical vapor deposition (LPCVD), typically using chlorosilane and ammonia as the precursor gases at temperatures in the range of about 700° C. In one application, about 100 nm of nitride is deposited each cycle on all the wafers in the oven. Similar processes are used for depositing polysilicon and silicon oxyntride. Other, high-temperature processes include oxidation, annealing, silicidation, and other processes typically using higher temperatures, for example above 1000° C. or even 1350° C.

Figure 1:
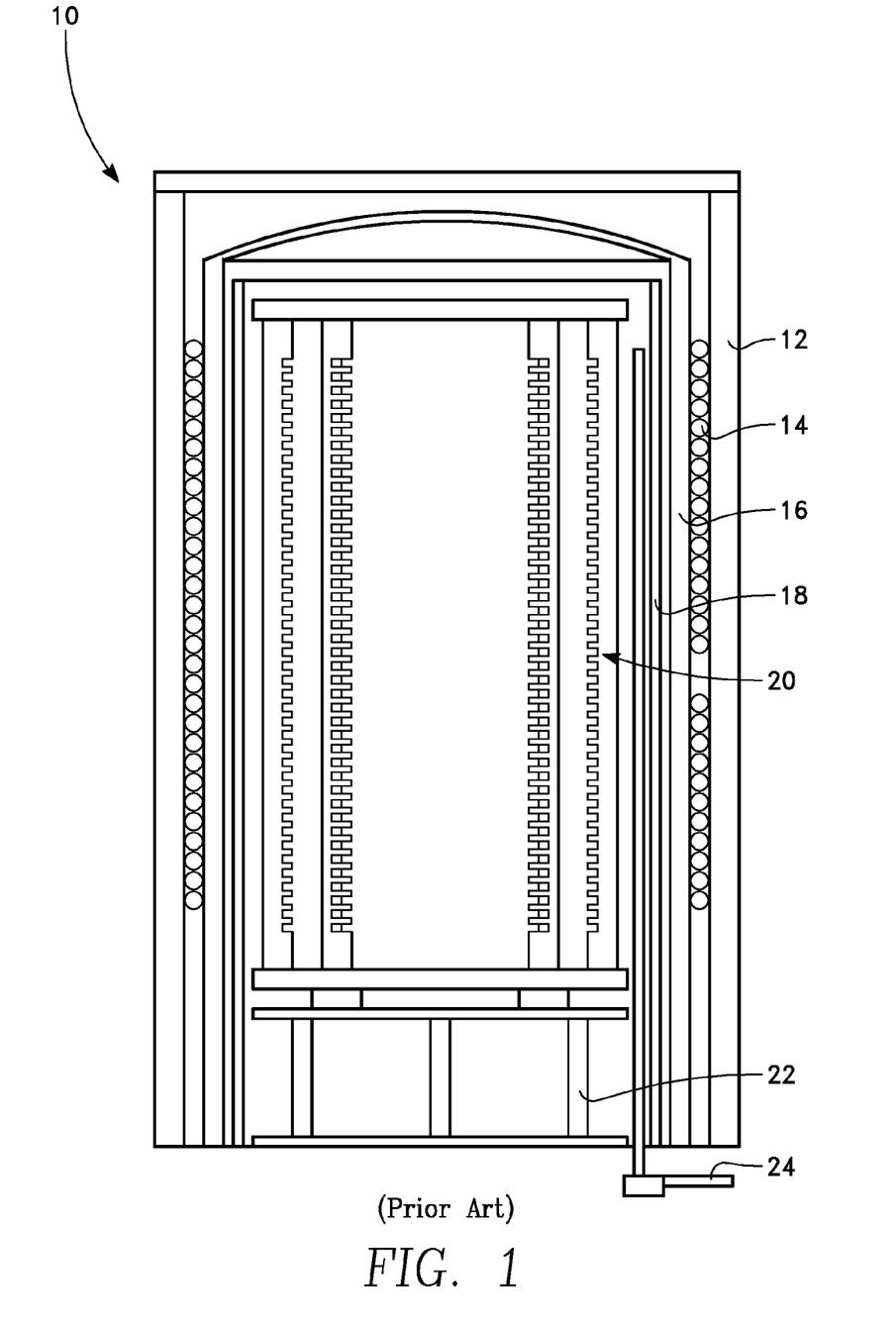
FIG. 1 is a schematic cross-sectional view of a typical thermal processing furnace.

For large-scale commercial production, vertical furnaces and vertically arranged wafer towers supporting a large number of wafers in the furnace are typically used, often in a configuration illustrated in the schematic cross-sectional view of FIG. 1. A furnace 10 includes a thermally insulating heater canister 12 supporting a resistive heating coil 14 powered by an unillustrated electrical power supply. A bell jar 16, typically composed of quartz, includes a roof and fits within the heating coil 14. An open-ended liner 18 fits within the bell jar 16. A support tower 20 sits on a pedestal 22 and during processing the pedestal 22 and support tower 20 are generally surrounded by the liner 18. It includes vertically arranged slots for holding multiple horizontally disposed wafers to be thermally processed in batch mode. A gas injector 24 is principally disposed between the liner 18 has an outlet on its upper end for injecting processing gas within the liner 18. An unillustrated vacuum pump removes the processing gas through the bottom of the bell jar 16. The heater canister 12, bell jar 16, and liner 18 may be raised vertically to allow wafers to be transferred to and from the tower 20, although in some configurations these elements remain stationary while an elevator raises and lowers the pedestal 22 and loaded tower 20 into and out of the bottom of the furnace 10.

The bell jar 18, which is closed on its upper end, tends to cause the furnace 10 to have a generally uniformly hot temperature in the middle and upper portions of the furnace. This is referred to as the hot zone in which the temperature is controlled for the optimized thermal process. However, the open bottom end of the bell jar 18 and the mechanical support of the pedestal 22 causes the lower end of the furnace to have a lower temperature, often low enough that the thermal process such as chemical vapor deposition is not effective. The hot zone may exclude some of the lower slots of the tower 20.

Figure 2:
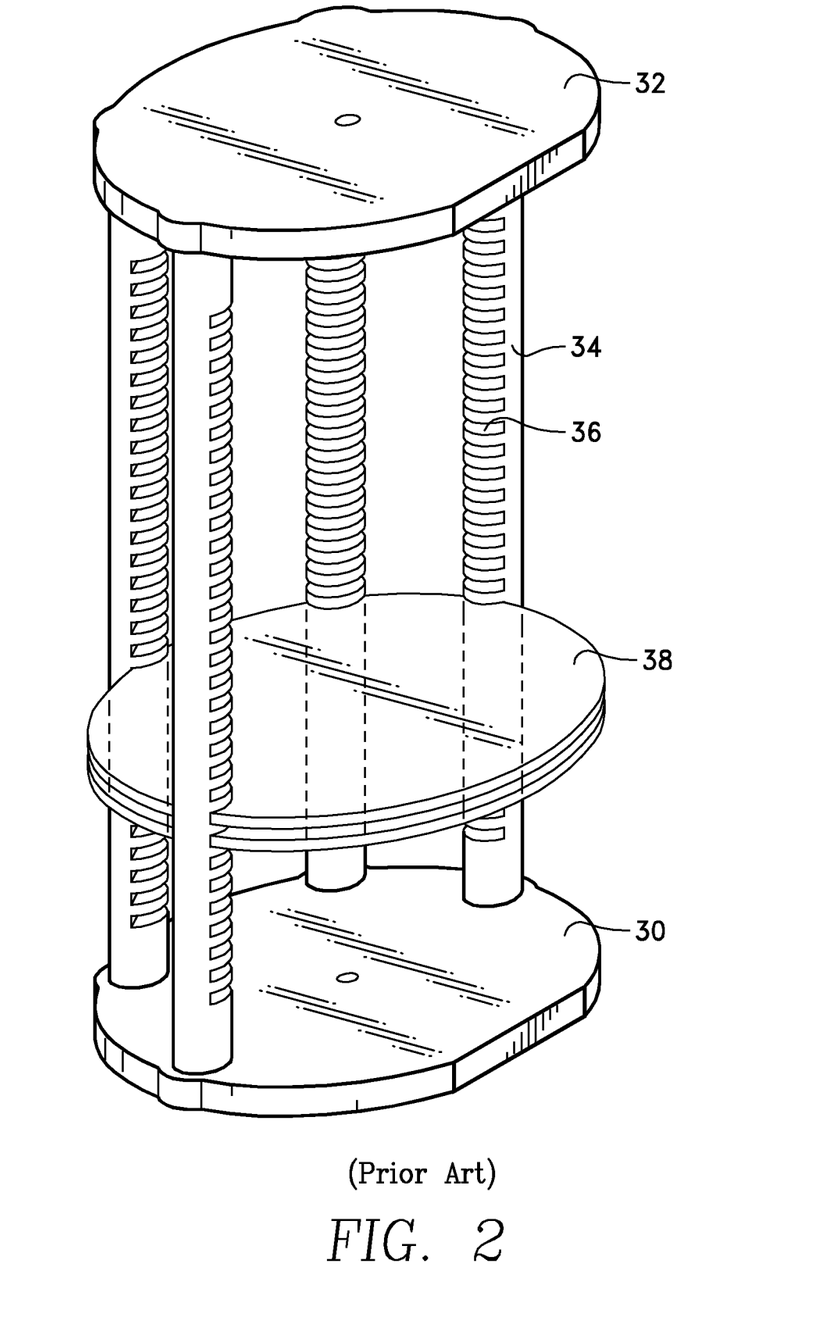
FIG. 2 is an orthographic view of a silicon tower advantageously used with the invention.

Conventionally in low-temperature applications, the tower, liner, and injectors have been composed of quartz or fused silica. However, quartz towers and injectors are being supplanted by silicon towers and injectors. One configuration of a silicon tower available from Integrated Materials, Inc. of Sunnyvale, Calif. is illustrated in the orthographic view of FIG. 2. It includes silicon bases 30, 32 bonded to three or four silicon legs 34 having slots formed therein to support multiple wafers 38. The shape and length of the fingers between the slots varies with the application and process temperature. The fabrication of such a tower is described by Boyle et al. in U.S. Pat. No. 6,455,395. Silicon injectors are also available from Integrated Materials, as disclosed by. Zehavi et al. in U.S. patent application Ser. No. 11/177,808, filed Jul. 8, 2005 and published as U.S. patent application publication 1006/1085589. Silicon liners have been proposed by Boyle et al. in U.S. Pat. No. 7,137,546.

The height of the tower can be modified according to the height of the furnace and may include slots for over 100 wafers. Such a large number of wafers has prompted the use of thermal buffer wafers and dummy wafers to assure that the production wafers are subjected to a uniform thermal environment within the hot zone. Both the top and the bottom of the stack of wafers in the tower during thermal process are subject to thermal end effects. Particularly, the bottom wafers are heated to a significantly lower temperature and the temperature may be low enough that the nitride CVD process or other thermal process is inactive. Accordingly, thermal baffle wafers rather than the substantially monocrystalline silicon production wafers are placed in the topmost and bottommost slots to thermally buffer the ends of the stack and provide a more uniform temperature distribution for the production wafers placed in between. Often, the pedestal 22 is configured to accept baffle wafers, which are left in the oven throughout many cycles. The thermal baffle wafers also act to scavenge impurities from the furnace ambient that tend to be more populous in the top and bottom of the furnace. It is not uncommon to use up to six or twelve thermal baffle wafers on each end. The baffle wafers may be reused for multiple cycles, but current baffle wafers are typically limited to no more than four or five cycles.

Silicon production wafers are often processed in batches of about 25 wafers, corresponding to the capacity of carrying cassettes transporting them between fabrication tools. The large number of wafer slots allows multiple batches to be simultaneously processed. However, there are situations when less than the maximum number of batches need thermal processing. These situations include process development in the laboratory and process calibration using test wafers every so often on the production. Nitride deposition tends to be sensitive to loading of the oven. That is, the process changes if not all wafer slots are filled. In these situations it is common to nonetheless fully populate the tower by inserting dummy wafers in the empty slots. Polysilicon deposition is subject to somewhat similar loading. On the other hand, oxidation tends to be relatively insensitive to loading.

Dummy wafers and the baffle wafers at the top of the oven on the upstream side of the flow of process gas need to be guarded against production of excessive particles because of film buildup. That is, every so many cycles, they need to be replaced with either fresh dummy and baffle wafers or refurbished ones. On the other hand, the baffle wafers at the bottom of the oven may still create particles but those particles tend not to affect the upstream production wafers.

Dummy and baffle wafers will be collectively referred to as non-production wafers.

Thermal buffer wafers and dummy wafers will be jointly referred to as non-production wafers.

In the past in conjunction with quartz towers, the non-production wafers were typically composed of quartz (fused silica), which are inexpensive and have the further advantage of being opaque to infrared radiation to thereby reduce the end effects of radiation greater than 4.5 μm (the transmissive edge for quartz) bathing the tower. However, just like quartz towels, quartz buffer and dummy wafers have been recognized to contribute to the generation of particles to a degree unsatisfactory for the fabrication of advanced devices. Production types of monocrystalline silicon wafers used as non-production wafers have not been completely successful. They have been observed to fracture easily in repeated use. Further in nitride deposition process, the silicon nitride is deposited on the non-production wafers to greater thicknesses in multiple uses and has been observed to flake off, again creating a particle problems. As a result, in advanced production monocrystalline silicon non-production wafers are limited to a lifetime of only a few cycles before they are discarded or refurbished.

Monocrystalline silicon wafers are currently used as dummy wafers. They closely resemble production wafers except that they may be formed from lesser grade silicon. They have not proved completely satisfactory. In one application for depositing LPCVD silicon nitride, it has been found necessary to replace them after they have accumulated about 330 nm of nitride because they begin shedding particles above this film thickness. Since some applications may be depositing 110 nm of nitride per cycle, the thickness limitation means that the dummy wafers need to be removed every three cycles or so. It is common to reclean the dummy wafers and resuse them. However, only two recleanings are typically performed because the monocrystalline wafers seem to develop streaks on further recleaning. Accordingly, after about 330 nm of nitride or three cycles, the dummy wafers are discarded.

Silicon carbide non-production wafers have also been used, particularly at higher temperatures. However, silicon carbide wafers, especially bulk silicon carbide grown by CVD, are expensive and are also subject to effects arising from the differential coefficient of thermal expansion between a silicon carbide wafer and a silicon tower.

Accordingly, less expensive non-production wafers are desired which nonetheless provide superior performance including ruggedness and ability to have greater thicknessdx of nitride and other material deposited thereon without flaking.

SUMMARY OF THE INVENTION

One aspect of the invention of the invention includes randomly oriented polycrystalline silicon (ROPSi), for example, grown by the Czochralski (CZ) method by drawing a seed from a silicon melt. The seed may be itself randomly oriented polycrystalline silicon. It may be cut from a rod of virgin polysilicon, also known as electronic grade silicon, grown by chemical vapor deposition (CVD) from precursors of silane-type materials. Alternatively, the seed may be cut from a CZ-grown ingot using a seed cut from an ingot grown by a CVD-traceable seed. In the latter case, at least a distant generation of the seed originated from virgin polysilicon or from a seed traceable to such a CVD-grown seed.

Another aspect of the invention includes polycrystalline buffer and dummy wafers, collectively non-production wafers. More preferably the polycrystalline wafers are cut from ingots grown from a randomly oriented polycrystalline silicon seed, for example, a CVD-traceable seed.

In typical use, non-production wafers of the invention are placed together with monocrystalline silicon production wafers on a tower and are simultaneously processed in a furnace or other thermal processing apparatus.

The non-production wafer may be prepared in a multi-step process. After being cut from the ingot, the wafer may be etched, for example, in an alkaline solution to reduce or eliminate strain. The wafer, preferably after strain etching, is subject to surface treatment producing sub-surface damage on its two principal surfaces and perhaps on its peripheral edge. The sub-surface damage may be performed by bead blasting or by grinding or machining. The surface-damaged wafer is then subjected to an acidic cleaning step and then to ultrasonic cleaning.

CZ grown or randomly oriented polysilicon is also useful for forming machined structures because of its purity, fine polycrystalline structure, and ruggedness.

DETAILED DESCRIPTION OF THE PREFERRED EMBODIMENTS

We believe that monocrystalline silicon wafers are inappropriate for use as baffle and dummy wafers, collectively referred to as non-production wafers. It is understood that production wafers often are not perfectly monocrystalline and may have several defects including dislocations and slips. However, the defects are typically minimal for reasonable yield in production and the typical goal is to obtain and maintain low-dislocation and slip-free monocrystalline production wafers.

If the edge of the monocrystalline wafer is chipped under repeated usage as a non-production wafer, the crack is likely to propagate across the wafer along crystalline cleavage planes and cause it to break. Commercial grade monocrystalline wafers are further inappropriate for non-production wafers because they are expensive. Although older wafers were surface treated on their back side while their front surfaces were polished, very advanced production has required polishing on both the front and back surfaces of production wafers. Monocrystalline wafers are also disadvantageous for multiple use as buffer and thermal wafers because of their tendency to warp into the shape of potato chips or other bowed shapes after extensive high-temperature processing. Semi-single crystalline non-production wafers have been used in the past, but they suffer from many of the disadvantages of monocrystalline non-production wafers, for example, fracturing along favored crystal planes.

Figure 3:
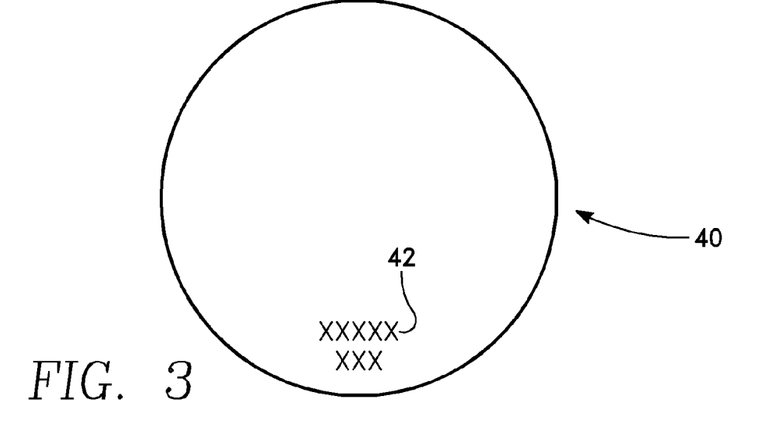
FIG. 3 is a plan view of a polysilicon non-production wafer of the invention.

Instead of monocrystalline production wafers, it is preferred that the non-production wafers be formed of polycrystalline silicon. A polysilicon non-production wafer 40 illustrated in plan view in FIG. 3 has a shape closely following that of a monocrystalline silicon production wafer but it has a visible random grain structure rather than the featureless surface of a monocrystalline wafer. The diameter of the non-production wafer should fall within industry standards for production wafers, that is, approximately 200 or 300 mm for most current wafer production but 150 mm wafers continue in use and 450 mm wafers are being contemplated. However, the non-production wafer be somewhat thicker and does not require standard wafer features such as orientation bevels or notches. Visible indicia 42, such as product number and serial number, may be formed on a principal surface. It is also preferred that both sides of the non-production wafers be surface treated to provide a more adherent base for the thicker layers deposited in multiple cycles.

Figure 4:
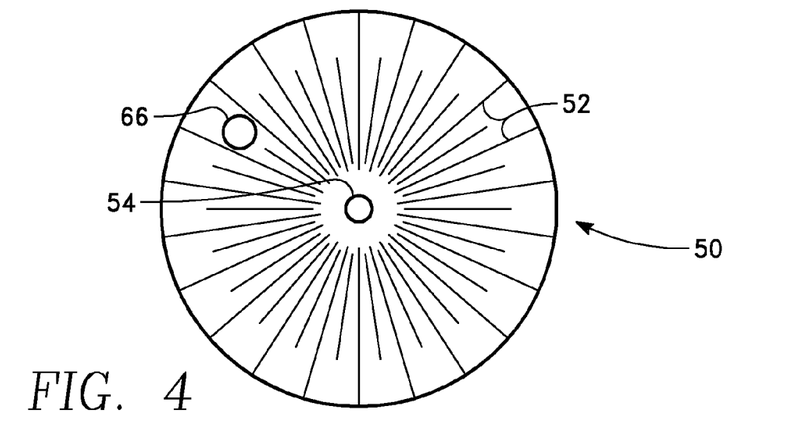
FIG. 4 is a cross-sectional view of a virgin polysilicon ingot.

Virgin polysilicon, also known as electronic grade silicon (EGS), is the source material for most Czochralski (CZ) grown silicon used for production wafers. Virgin polysilicon has been recently used for fabricating wafer towers and other structures, as described in the above two patent documents to Boyle et al. Virgin polysilicon is grown by the chemical vapor deposition of silane or halosilane at about 600° C. or above in the presence of hydrogen upon a hot seed rod of silicon. Other silanes such as disilane could be substituted. See Wolf et al., *Silicon Processing for the VLSI Era: Volume 1—Process Technology*, 2d. ed., Lattice Press, 2000, pp. 5-8. Virgin poly grown from $SiH_4$ has possible advantages because of its purity, but virgin poly grown from $SiCl_3H$ or other halosilanes is more economic. As grown, a virgin polysilicon ingot 50 has a cross-sectional structure illustrated in FIG. 4. Crystalline dendrites 52 extend outwardly from a seed rod 54. Virgin polysilicon is typically grown with high internal stresses, which normally prevent the material from being machined. However, as explained by Boyle et al., if the virgin polysilicon is annealed, it may be machined since the annealing removes the stress. Virgin poly grown from pure silane ($SiH_4$) usually has smaller crystallites than that grown from trichlorosilanes.

According to one aspect of the invention, polycrystalline silicon ingots can also be grown (drawn or pulled from the silicon melt) by the Czochralski (CZ) method described by Wolf et al., ibid. at pp. 8-21 for monocrystalline ingots. Polycrystalline CZ silicon in large sizes is available from a small number of companies. Such silicon contains many crystallites but the exposed face is typically composed of crystallites which are <100>-oriented within ±20° of the surface normal although other favored orientations such as <111> or <110> can be obtained under the proper conditions. Such semi-single material can be surface treated. It is less prone to crack propagation than monocrystalline silicon, but cracks can nonetheless propagate because of the preferred orientation. Polycrystalline silicon cast in quartz molds is also available, but its purity level is inferior to that obtained from CZ-grown polysilicon.

In general, according to one aspect of the invention, polycrystalline CZ silicon, which tends to be randomly oriented, may be obtained by using a polycrystalline silicon seed, preferably randomly oriented polycrystalline silicon (ROPSi), rather than the typical monocrystalline seed or the occasionally previously used polycrystalline seed derived from semi-single silicon. A standard Czochralski crystal growing furnace may be used but a conically shaped heat shield should be included which extends to within 40 mm of the melt surface. Chamber pressure of backfilled argon may be maintained in the range of 10 to 50 Torr. After the virgin polysilicon or possibly discarded CZ charge has melted and the temperature has stabilized, the seed is dipped into the melt surface and maintained there until the seed/melt interface has formed a smooth meniscus. The seed is then pulled at a rate sufficient that no neck forms which is less than the seed diameter. A simple conical expansion region joining the seed to a 200 mm or 300 mm ingot may extend over 10 to 20 cm. The pull rate is then adjusted to maintain the desired ingot diameter. The polysilicon CZ ingot may be pulled faster than a monocrystalline CZ ingot. Only minimal tail end taper is needed at the end of the pulling. The pulled ingot should be slowly cooled at ambient.

Figure 5:
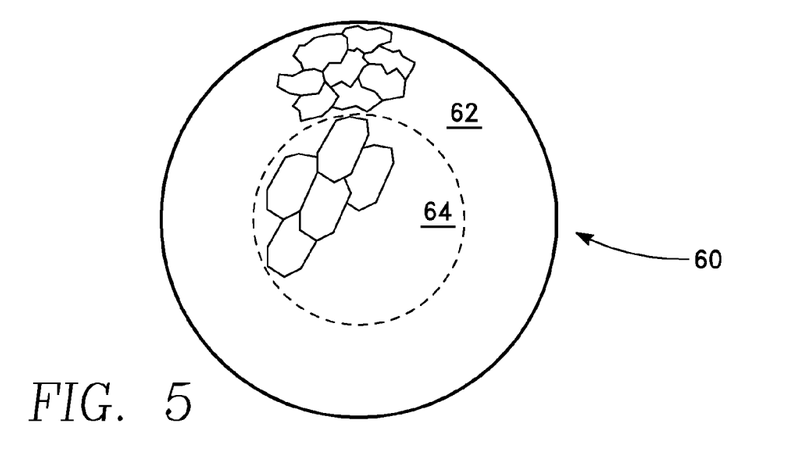
FIG. 5 is a cross-sectional view of a Czochralski polysilicon ingot grown from a virgin polysilicon seed as well as a plan view of a non-production wafer cut therefrom.

A polycrystalline CZ ingot 60 illustrated in the cross-sectional view of FIG. 5 grown from a polycrystalline seed of virgin poly produced from either $SiH_4$ or $SiCl_3H$ precursor gas has been observed to produce an outer zone 62 of crystallites of somewhat irregular shapes and an inner zone 64 of somewhat larger crystallites of more symmetric shape sized typically less than 1 cm. The figure does not accurately illustrate the size of the crystallites. In some runs, the crystallites of 3 to 10 mm were randomly distributed across the wafer. Generally, growth conditions may be varied to control the distribution with a desirable distribution in the range of 1 to 10 mm One embodiment of inventive CZ polycrystalline growth uses a seed rod 66, illustrated in FIG. 4, cut from the outer region of the virgin poly ingot 50 along the axis of the ingot 50 after the ingot 50 has been annealed to allow its machining. Such a virgin poly seed used in CZ growth produces an ingot 60 illustrated in the cross-sectional view of FIG. 5. The material of such a CZ ingot 60 can be characterized as CVD-source silicon because its crystal structure is traceable to the CVD-produced virgin poly.

Ingots 60 have been grown by Kayex of Rochester, N.Y. under the direction of the present inventors using silicon seed rods having a diameter of about 1 cm and a length of about 20 cm. Seeds of both virgin polysilicon materials formed by either $SiH_4$ and $SiHCl_3$ used as the CVD precursor gas have produced substantially similar CZ results.

The crystallography of slices or wafers of such material has been established by Laue X-ray experiments. The polysilicon has been determined to exhibit substantially random orientation of its crystallites with no preferred normal orientation relative to the ingot axis or any other axis.

Figure 6:
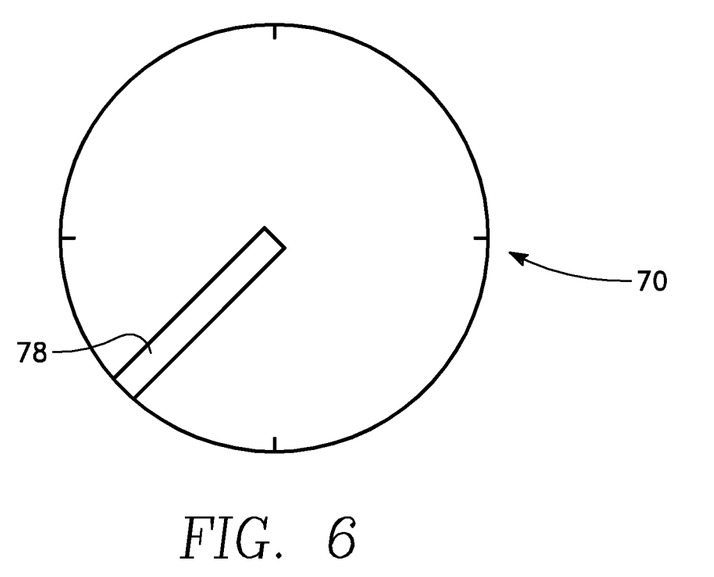
FIG. 6 is a cross-sectional view of a CVD-source Czochralski polysilicon ingot as well as a plan view of a non-production wafer cut therefrom.

It is possible use a polycrystalline CZ ingot 70, illustrated in the cross-sectional view of FIG. 6, (which may be the ingot 60 of FIG. 5) as a source for further seeds, for example by cutting a radial plug 78 from the ingot 70 or a thick slice thereof and using that plug as the seed for another generation of polycrystalline CVD-source silicon. In particular, the end of the plug 78 nearer the outer edge of the ingot may have a smaller crystallite size and is the preferred portion of the seed to contact the silicon melt. If necessary to obtain a seed rod of sufficient length, a shorter ROPSi seed may be welded or otherwise bonded to a longer silicon rod since most of the seed rod assembly never dips into the melt and the longer rod can be reused. Further generations of CVD-source CZ ingots can be grown by using a seed developed from the previous generation. CVD-source seeds includes the original generation of virgin poly grown from any types of silane-containing precursor material including without limitation $SiH_4$, $SiClH_3$, $SiCl_2H_2$, $SiCl_3H$, and $SiCl_4$ as well as other halosilanes and multi-silanes and further generations of seeds cut from CZ polycrystalline silicon having a seed traceable to the virgin poly seed.

Other types of polycrystalline silicon especially randomly oriented polycrystalline silicon may be used with non-production wafers of the invention. The polysilicon wafers may be formed from cast silicon or be Czochralski-drawn with a seed other than a virgin polysilicon one.

The fabrication of the buffer and dummy wafers from the polycrystalline ingot follows in part the process used to fabricate monocrystalline production wafers from a monocrystalline ingot. The ingot needs to have diameter somewhat larger than the wafer. Advanced commercial production is gradually moving from diameters of 200 mm to 300 mm although standard wafer sizes continue at 75 mm, 100 mm, 125 mm, and 150 mm. The next generation of wafers is expected to have diameters of 450 mm.

Figure 7:
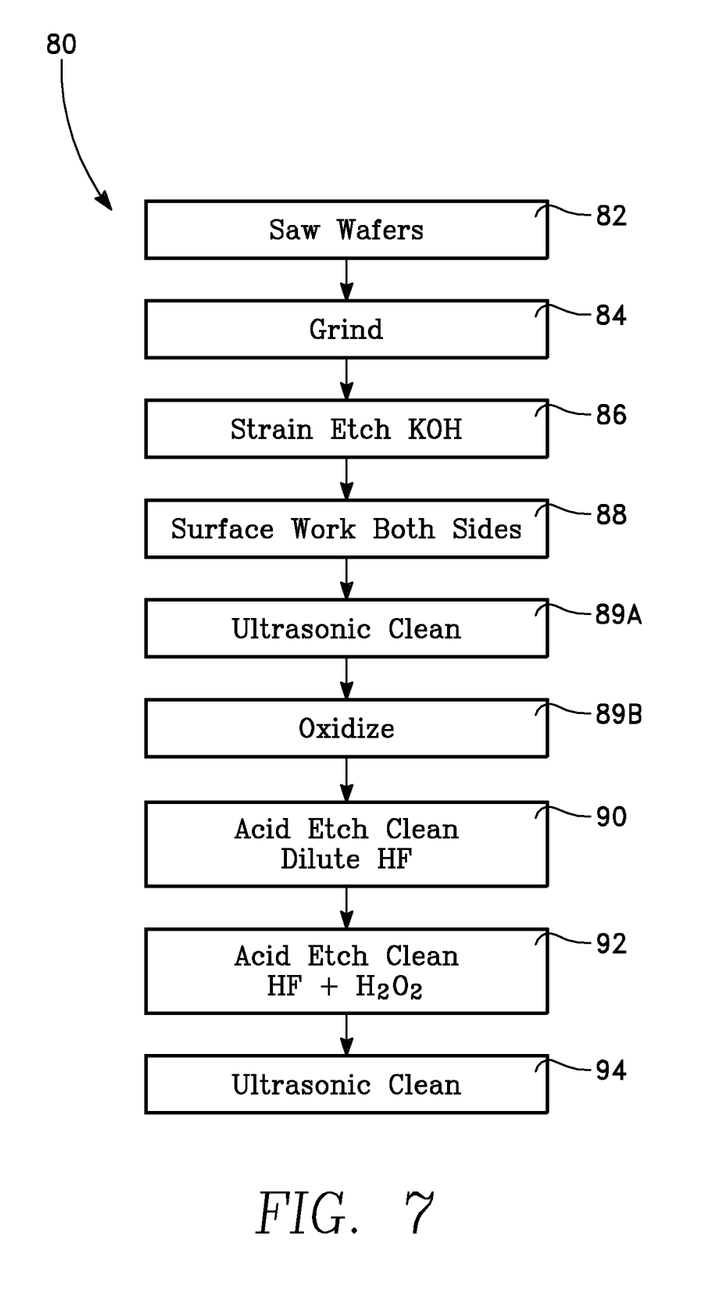
FIG. 7 is one embodiment of a process sequence for processing polycrystalline silicon non-production wafers.

The polycrystalline ROPSi or other polysilicon wafers may be formed in a process 80 illustrated generally in the flow diagram of FIG. 7, which combines and adapts the standard production wafer processing described by Wolf et al., ibid. pp. 22-31 and the process used to form virgin poly towers as described in the two references to Boyle et al. Some of the steps may be omitted depending upon performance requirements and fabrication results. The CZ polysilicon seems to be easily machined without further anneal, presumably because the CZ pulling from the melt effectively anneals the polysilicon. In step 82, polycrystalline wafers are cut from the ingot with a wire saw or internal or external circular saw preferably using diamond cutting edges or diamond slurry.

Figure 8:
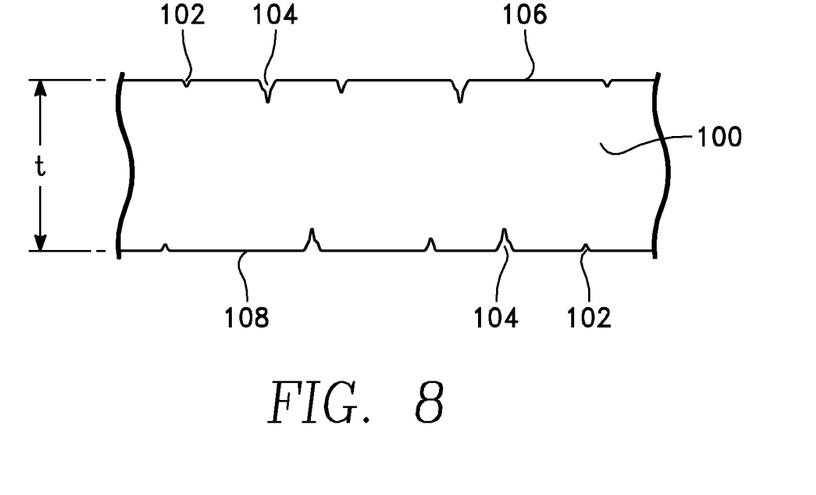
FIG. 8 is a cross-sectional view of a polysilicon wafer roughened on both sides.

In step 84, the polysilicon wafer is ground to the desired circular shape and both sides of the polysilicon wafer may be flat ground with a Blanchard grinder using a diamond grit in a process similar to lapping. Their edges are preferably shaped similarly to production wafers. Production wafers typically have thicknesses of 0.725 mm for 200 mm wafers or 0.775 mm for 300 mm wafers. It is desirable to make the buffer and dummy wafers as rugged as possible so thicker non-production waffles have advantages. Accordingly, initial batches of non-production wafers have been prepared with thicknesses of 1.0 to 1.5 mm or even 2 mm. That is, as illustrated in cross-sectional view of FIG. 8, a non-production wafer 100 preferably has a thickness t in the range of 0.725 to 1.5 mm or perhaps 0.725 to 2 mm. Most production equipment can accommodate these slightly thicker wafers. It is expected though that non-production wafers of thickness substantially equal to that of production wafers will prove satisfactory in commercial use although they may be less rugged than the thickness ones. The grinding introduces sub-surface work damage including, as illustrated in FIG. 8, cracks 102 and crevices 104 to a depth of 25 to 50 μm from both principal surface 106, 108 of the wafer 100 of thickness t. As Zehavi et al. explain in U.S. patent application Ser. No. 11/521,199, filed Sep. 14, 2006 and published as U.S. patent application publication 2007/0006799, such features provide anchors for films deposited on roughened silicon. Such features, when developed on non-production wafer, anchor the accumulation of thick layers deposited over many cycles of production, thereby reducing flaking and resultant particulates. The wafer cutting may provide the needed sub-surface work damage. Note that there is no polishing step, as performed on production wafers, which would remove the sub-surface damage.

An optional caustic or alkaline strain-reducing etch 86 is performed by immersing the polycrystalline wafers in dilute potassium hydroxide (KOH). The strain etch 86 relieves strain and generally cleans the wafers. However an alternative process simply ultrasonically cleans the wafer in a bath of deioinized (DI) water. A surface treatment step 88 is performed upon both principal surfaces of the wafer to remove visible surface features of sawing and grinding, to further develop the sub-surface work damage, and leave a uniformly gray surface. The surface treatment may include Blanchard grinding or machining which produces desirable sub-surface work damage. If such subsequent surface work by grinding is not required, bead blasting using silicon carbide powder may be used to remove visible surface features of sawing and grinding.

After the surface working, in step 88A, the wafer is ultrasonically cleaned. In step 89B, the wafer is oxidized, for example, in an air ambient at 1100° C. for 15 hours. A first acid cleaning step 90 is performed by immersing the polycrystalline wafers in dilute hydrofluoric acid (HF). The first acid cleaning step 90 is effective at removing any silicon oxide on the wafer surface. A second acid cleaning step 92 is performed by immersing the wafers in a mixture of water, H F, and hydrogen peroxide ($H_2O_2$) although nitric acid ($HNO_3$) and hydrochloric acid (HCl) may be substituted for the HF. The second acid cleaning step 92 is effective at removing heavy metals from near the surface of the wafer. Other acid etchants or other types of cleaning agents may be substituted, for example, those well developed for cleaning commercial silicon wafers or others used in the chemical analysis of wafers and equipment. An ultrasonic cleaning step 94 is performed by immersing the wafers in a bath of deionized (DI) water and ultrasonically exciting the DI water to thereby clean particles from the surface of the wafers. Note that the illustrated process does not include the polishing performed on at least the device side of production wafers. If desired, a product number and serial number and other identifying indicia may be etched into a principal face of the non-production wafers to facilitate inventory and use. Also, depending on the fab practices, the non-production wafers may be pre-coated on both sides with a layer of the CVD-deposited material with which the non-production wafer will be used, for example, silicon nitride, which is strongly anchored in the cracks and crevices. The polycrystalline wafers are then ready for use by the fab lines.

Such polycrystalline non-production wafers have lifetimes much longer than monocrystalline ones. Their purity level is much higher and their particle production much lower than the conventional quartz non-production wafers. If the deposition accumulates to an excessive thickness on the polycrystalline non-production wafer, they wafers may be refurbished, for example by removing a portion of the accumulated thickness or by removing it all and redoing some of the wafer fabrication steps of FIG. 7. The polysilicon wafers may be refurbished or recleaned by immersing them in HF such that the nitride is removed. They can then be returned to service.

Preliminary tests have shown that 2.5 microns of silicon nitride may be deposited in an LPCVD process on so treated polysilicon dummy wafers without significant flaking. This is far above the thickness limit of 330 nm used in the past before the dummy wafers were discarded. A thickness limit of 2 microns has been imposed by a fab line as a justification for a major change in their use of dummy wafers. Even a thickness limit of 1 micron would represent a significant improvement over the prior art. Further, reclaimed polysilicon dummy wafers do not exhibit the striping and streaking observed for reclaimed monocrystalline silicon dummy wafers so that it may be possible to reclean the inventive dummy wafers more than two times. Clearly, the inventive polysilicon wafers may be used as baffle wafers in the same LPCVD process.

It may be desired to continue to use some quartz wafers for thermal buffering, particularly at the bottom portion of the tower which is out of the hot zone. The quartz buffer wafers provide the desired opaqueness to infrared radiation. However, polycrystalline wafers are preferably used throughout the hot zone of the furnace in which deposition is occurring. As a result, the entire hot zone may be filled with silicon, including the tower, the liner, the injectors, the production wafers, and the buffer and dummy wafers. No materials other than silicon are present in significant amount in the hot zone to create problems of contamination or thermal expansions.

However, it possible to modify polycrystalline wafers to provide the required infrared opaqueness especially of the buffer wafers. The ROPSi material from which the dummy wafers are formed may be grown with sufficient semiconductor doping to decrease the resistivity to below 1 ohm-cm and preferably below 0.1 ohm-cm or even lower at which the silicon wafer is substantially opaque to the infrared thermal radiation inside a furnace. See Wolf ibid. for CZ growth of doped silicon. Boron is the preferred dopant and it is conventional to grow CZ silicon with such doping. It is also possible to pre-coat the dummy wafers with a sufficient thickness of silicon nitride (or possibly other material) that provides the necessary absorption in the infrared.

The polycrystalline CZ silicon, particularly the CVD-source CZ silicon, may be applied to uses other than non-production wafers. A smaller crystalline structure facilitates the machining of the silicon. The polycrystalline CZ material advantageously has smaller crystal sizes. One application for polycrystalline CZ silicon is forming the two bases of the tower.

Figure 9:
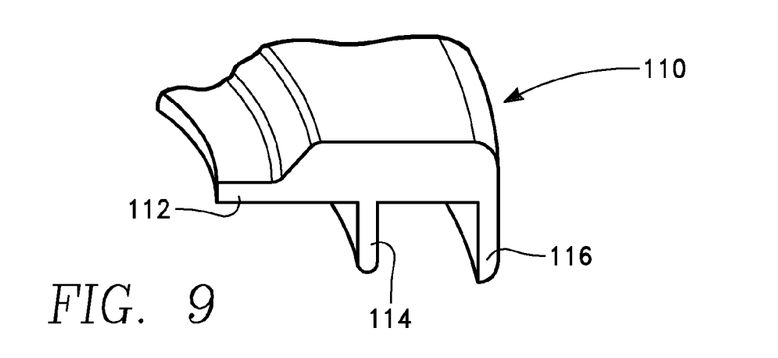
FIG. 9 is a sectioned orthographic view of one type of a wafer ring, in particular, an RTP edge ring.
Figure 10:
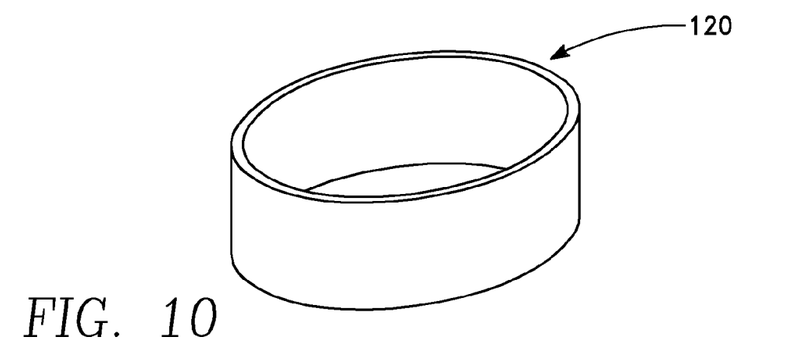
FIG. 10 is an orthographic view of a silicon tube used to support and rotate the edge ring of FIG. 9.

Other possible uses are for edge support rings, such as a ring 110 illustrated in FIG. 9 having a thin inwardly extending annular lip 112 for supporting the periphery of a wafer, in rapid thermal processing (RTP). It is desired to decrease the thickness of the lip 112 to no more than 20 mils (0.5 mm), which is difficult to achieve in polycrystalline silicon other than that of the invention. Two descending annular rims 114, 116 capture a rotary tube 120 illustrated in the orthographic view of FIG. 10 supporting and spinning the edge ring 110 and the wafer supported on it. Less complex structures for edge rings are known. Other similar rings include edge exclusion rings in which the lip or similar overhang overlies and is spaced from the wafer periphery to protect it from deposition and clamp rings which contact the upper wafer periphery to clamp it to a pedestal during processing. The support tube 120 may also be fabricated from the polycrystalline CZ silicon of the invention. The edge rings and support tube composed of silicon used for RTP of silicon production wafers not only provide high purity levels but also simplify the radiation and thermal expansion problems present when these components are made of other material.

Figure 11:
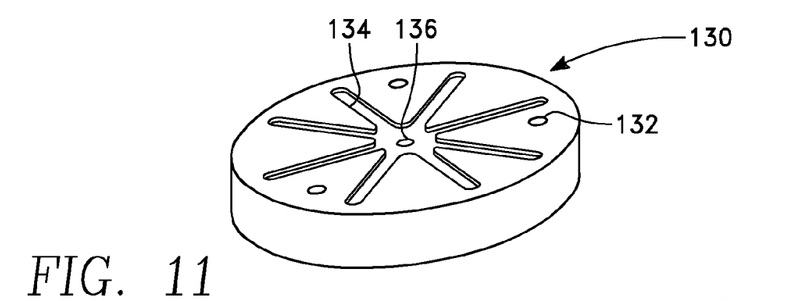
FIG. 11 is an orthographic view of a silicon pedestal platen.

Other applications of the CZ silicon of the invention include pedestal platens, such as platen 130 illustrated in FIG. 11 may be formed of preferably randomly oriented CZ polycrystalline silicon to support a wafer for wafer processing. The generally disk-shaped platen 130 may include axial through holes 132 for lift pins or a branch structure of shallow recesses 134 and a supply hole 136 for a thermal transfer gas. Machining of such fine features is facilitated by the CZ polycrystalline silicon of the invention. Such tower bases, wafer rings, support tubes, and pedestals as well as other chamber parts may require a diameter somewhat greater than the diameter of the wafer being processed. However, poly CZ ingots of sufficient diameters can be pulled in the same CZ pullers used to form the ingots used for the production wafers since the diameter of the monocrystalline CZ ingot is substantially smaller than the diameter of the crucible from which it is being pulled because of the extreme requirements of uniformity imposed on monocrystalline wafers. Such a high degree of uniformity is not required for structural members so larger poly CZ ingots can be grown in the same equipment using a poly seed and adjusting the growth conditions for a larger diameter, for example, by decreasing the pull rate.

Figure 12:
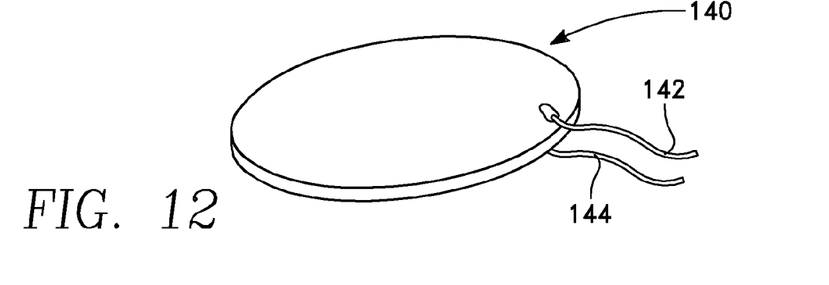
FIG. 12 is an orthographic view of a CZ solar cell.

One use of CZ polycrystalline silicon, particularly poly grown from a virgin polysilicon or CVD-source seed is to form solar cells 140, illustrated in the orthographic view of FIG. 12, in which vertical p-n junctions are formed in slices of silicon, which may be left in their round ingot size or cut into rectangular shape. Electric contacts 142, 144 are made to the front and back sides of the solar cell 140. The random orientation of CZ crystallites produces a stronger material and thus allows the solar cells to be formed of thinner semiconducting layers of silicon of relatively small crystallite size but of large surface area. Also, the high purity of CZ polycrystalline silicon versus cast silicon provides better semiconductive characteristics since it is believed that the impurities in polycrystalline silicon migrate to the grain boundaries and promote electrical leakage along the boundaries.

Although dummy wafers of the invention find particular advantage in LPCVD of silicon nitride, non-production wafers used as dummy and baffle wafers may be used with many processes including CVD of polysilicon, silicon oxynitride, silicon dioxide, and other deposition processes and more generally any thermal process.

Although polysilicon non-production wafers are advantageously used in combination with silicon towers, they have advantages for use in towers and boats of other materials including quartz and silicon carbide.

Silicon wafer boats are another wafer support fixture advantageously used in silicon processing. In a wafer boat, the wafers are arranged in a horizontally extending array in slots within the boat and are oriented with the principal surfaces tilted a few degrees from vertical. As a result, the wafer edge rests on the bottom of the boat and the teeth of the slots contact and support a backside of the wafers. Non-production wafers of the invention may be advantageously used with boats as well as towers.

The randomly oriented polycrystalline silicon of the invention offers many advantages for non-production wafers and well for other rugged members and structures and the material can be grown CZ techniques well developed for commercial monocrystalline wafers.

The invention claimed is:

1. A method of growing polysilicon, comprising:
   applying a substantially randomly oriented polycrystalline silicon seed to a silicon melt such that portions of said silicon melt condense on said randomly oriented polycrystalline silicon seed; and
   drawing the randomly oriented polycrystalline silicon seed and attached condensed silicon melt away from the melt.

2. The method of growing polysilicon according to claim 1, wherein the randomly oriented polycrystalline silicon seed comprises virgin polysilicon.

3. The method of growing polysilicon according to claim 1, further comprising:

growing the randomly oriented polycrystalline silicon seed by chemical vapor deposition.

4. The method of growing polysilicon according to claim 1, wherein the randomly orientated polycrystalline silicon seed comprises a CVD-source randomly oriented polycrystalline silicon seed.

5. The method of growing polysilicon according to claim 1, wherein the randomly oriented polycrystalline silicon seed is a successor seed, and further comprising:
  applying a substantially randomly oriented polycrystalline silicon predecessor seed to a silicon melt such that portions of said silicon melt condense on said predecessor seed;
  drawing the predecessor seed and attached condensed silicon melt away from the melt to form an ingot; and
  cutting the successor seed from the ingot.

6. A method of thermally processing silicon wafers with a first cycle comprising:
  disposing in first slots of a support tower at least one production wafer comprising substantially monocrystalline silicon;
  disposing in second slots of the support tower at least one baffle wafer comprising polycrystalline silicon;
  heating the support fixture and supported production and baffle wafers to thermally process the at least one production wafer.

7. The method of thermally processing silicon wafers according to claim 6, wherein the at least one baffle wafer comprises undoped polysilicon, and the first cycle further comprising:
  disposing thermal buffer wafers in slots spaced from the first slots by the second slots toward an end of the support tower, the thermal buffer wafers comprising a material other than undoped polysilicon.

8. The method of thermally processing silicon wafers according to claim 7, wherein the material of the thermal buffer wafers comprises either quartz or SiC.

9. The method of thermally processing silicon wafers according to claim 6, wherein the material of the thermal buffer wafers comprises doped polysilicon.

10. The method of thermally processing silicon wafers according to claim 6, wherein the support tower is a silicon tower, and the first cycle further comprising:
  disposing in a furnace the silicon tower and the at least one production wafer and the at least one baffle wafer supported thereupon;
  surrounding lateral sides of the support tower with a silicon liner;
  heating the at least one production wafer and the at least one baffle wafer supported on the tower to an elevated temperature; and
  flowing a process gas through at least one silicon injector having an outlet disposed between the silicon tower and the silicon liner to react with the at least one production wafer in a hot zone of the furnace within the silicon liner.

11. The method of thermally processing silicon wafers according to claim 10, wherein the silicon tower, the silicon liner, the at least one silicon injector, and the at least one baffle wafer within the hot zone are substantially free of material other than silicon.

12. The method of thermally processing silicon wafers according to claim 10, wherein the at least one baffle wafer comprises randomly oriented polycrystalline silicon.

13. The method of thermally processing silicon wafers according to claim 10, further comprising:
  a subsequent second cycle comprising:
  disposing in first slots of the support tower at least one other production wafer and the at least one baffle wafer, wherein the at least one other production wafer comprises substantially monocrystalline silicon; and
  heating the support tower and the at least one other production wafer and the at least one baffle wafer supported thereon to thermally process the at least one other production wafer.

14. The method of thermally processing silicon wafers according to claim 13, wherein the at least one baffle wafer comprises Czochralski (CZ) polysilicon.

15. The method of thermally processing silicon wafers according to claim 14, wherein the at least one baffle wafer comprises CVD-source CZ polysilicon.

16. The method of thermally processing silicon wafers according to claim 10, wherein the at least one baffle wafer comprises randomly oriented polycrystalline silicon.

* * * * *